United States Patent
Lin et al.

(10) Patent No.: US 10,423,266 B2
(45) Date of Patent: Sep. 24, 2019

(54) SELF-LUMINESCENCE DISPLAY APPARATUS WITH TOUCH FUNCTION

(71) Applicant: HON HAI PRECISION INDUSTRY CO., LTD., New Taipei (TW)

(72) Inventors: Chien-Wen Lin, New Taipei (TW); Yu-Fu Weng, New Taipei (TW); Chia-Lin Liu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/673,783

(22) Filed: Aug. 10, 2017

(65) Prior Publication Data

US 2018/0046306 A1    Feb. 15, 2018

Related U.S. Application Data

(60) Provisional application No. 62/374,501, filed on Aug. 12, 2016.

(51) Int. Cl.
| | |
|---|---|
| G06F 3/041 | (2006.01) |
| G06F 3/044 | (2006.01) |
| H01L 27/32 | (2006.01) |
| H01L 51/52 | (2006.01) |

(52) U.S. Cl.
CPC ............ *G06F 3/0414* (2013.01); *G06F 3/044* (2013.01); *G06F 3/0412* (2013.01); *G06F 3/0416* (2013.01); *H01L 27/323* (2013.01); *H01L 27/3262* (2013.01); *H01L 27/3276* (2013.01); *H01L 51/5221* (2013.01); *H01L 51/5237* (2013.01)

(58) Field of Classification Search
CPC ..................................................... G06F 3/0414
USPC .......................................................... 345/174
See application file for complete search history.

(56) References Cited

U.S. PATENT DOCUMENTS

| | | | |
|---|---|---|---|
| 2015/0097167 A1* | 4/2015 | Song ................... | H01L 51/5044 257/40 |
| 2017/0235414 A1* | 8/2017 | Ding ...................... | G06F 3/047 345/174 |
| 2017/0284883 A1* | 10/2017 | Yang ..................... | G01L 9/0072 |
| 2017/0308240 A1* | 10/2017 | Yeh .......................... | G06F 3/044 |
| 2018/0031885 A1* | 2/2018 | Nakamori ............... | G01L 1/146 |

FOREIGN PATENT DOCUMENTS

TW         201710853 A1      3/2017

* cited by examiner

*Primary Examiner* — Long D Pham
(74) *Attorney, Agent, or Firm* — ScienBiziP, P.C.

(57) ABSTRACT

A self-luminescence display apparatus includes a display panel having a plurality of conductive layers and a supporting frame. One of the conductive layers cooperates with the supporting frame to form a plurality of force sensing capacitors. When a touch action is applied, the display panel deforms according to pressure applied, which cause the capacitances of the force sensing capacitors to alter, which corresponds to a place where the touch operation applied on.

4 Claims, 11 Drawing Sheets

SELF-LUMINESCENCE DISPLAY APPARATUS WITH TOUCH FUNCTION

CROSS-REFERENCE TO RELATED APPLICATIONS

This application claims priority to U.S. Provisional Application No. 62/374,501 filed on Aug. 12, 2016, the contents of which are incorporated by reference herein.

FIELD

The subject matter herein generally relates to a self-luminescence display apparatus.

BACKGROUND

Active matrix organic light emitting diode (AMOLED) display panel has advantages of excellent color representation and thinness. AMOLED display panel can be manufactured by incorporating a touch panel in the AMOLED display panel. Such AMOLED display panel is used as an output device for displaying images while also being used as an input device. However, the AMOLED display panel cannot always accurately sense the pressure of a touch action applied on the touch screen panel. Improvement in the art is preferred.

BRIEF DESCRIPTION OF THE FIGURES

Implementations of the present disclosure will now be described, by way of example only, with reference to the attached figures.

DETAILED DESCRIPTION

Figure 1:
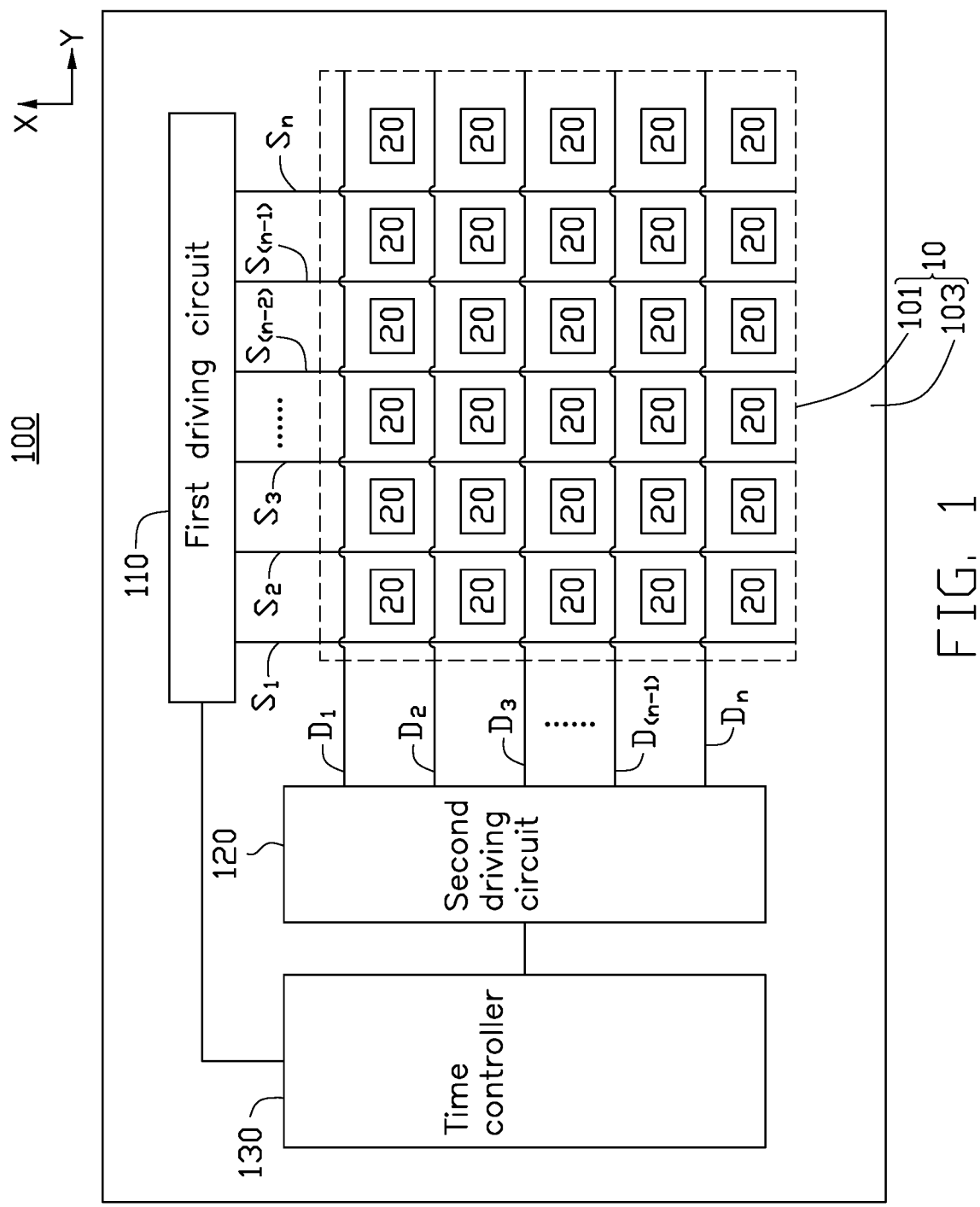
FIG. 1 is a diagram of an exemplary embodiment of a self-luminescence display apparatus, the self-luminescence display apparatus comprises a plurality of pixel units corresponding to pixel driving circuits.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like. The term "circuit" is defined as an integrated circuit (IC) with a plurality of electric elements, such as capacitors, resistors, amplifiers, and the like.

The present disclosure provides a self-luminescence display apparatus with functions of sensing a position and pressure of a touch applied on the self-luminescence display apparatus.

FIG. 1 illustrates an exemplary embodiment of the self-luminescence display apparatus 100. The self-luminescence display apparatus 100 is capable of sensing not only touch position when a user's finger is pressed on the self-luminescence display apparatus 100 but also the pressure of the user's finger. In at least one exemplary embodiment, the self-luminescence display apparatus 100 is an active matrix organic light emitting diode (AMOLED) display apparatus.

Figure 4:
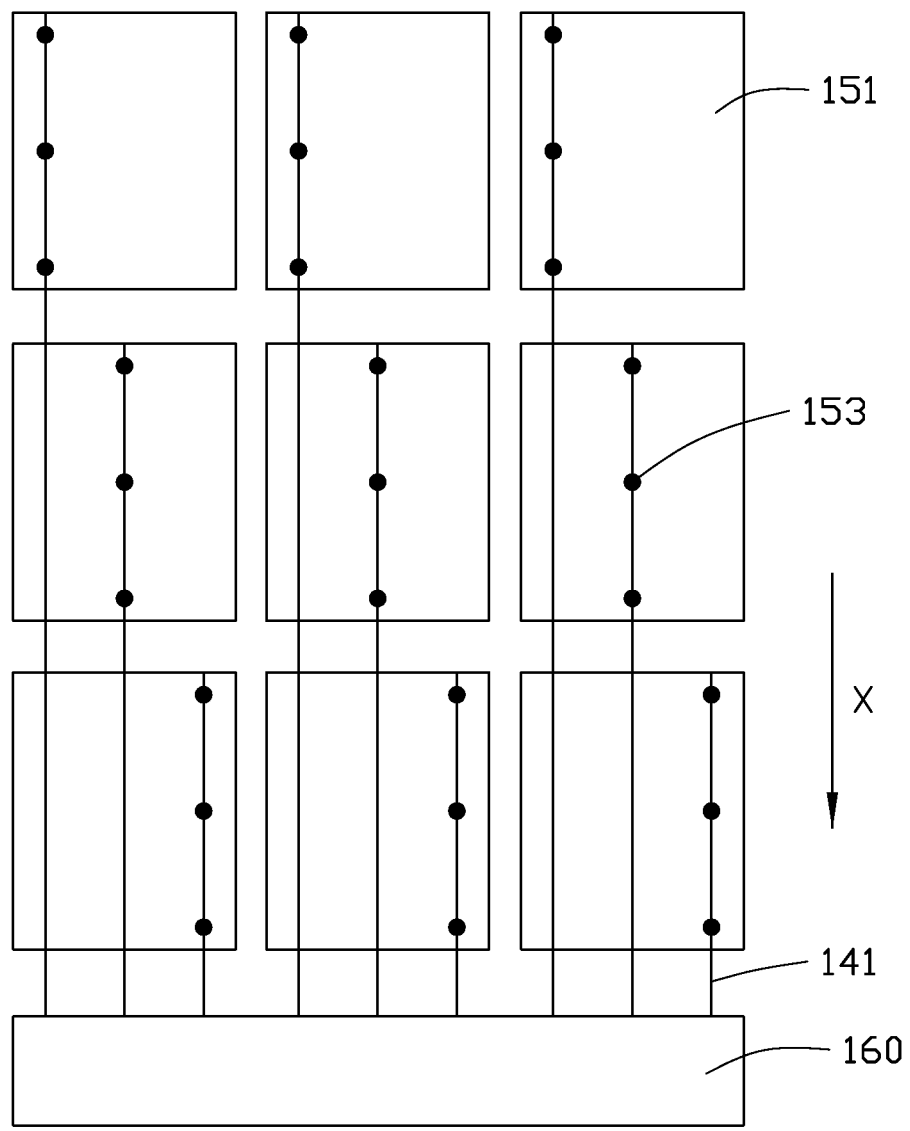
FIG. 4 is a planar view of an exemplary embodiment of a first conductive layer of the self-luminescence display apparatus of FIG. 3.

The self-luminescence display apparatus 100 includes a display panel 10, a first driving circuit 110, a second driving circuit 120, a time controller 130, and a touch circuit 160 (as shown in FIG. 4). The display panel 10 defines a display region 101 and a non-display region 103. The display region 101 is surrounded by the non-display region 103. In at least one exemplary embodiment, the first driving circuit 110 is located at a first side of the display region 101, the second driving circuit 120 and the time controller 130 are located at a second side of the display region 101 adjacent to and connecting with the first side. In other exemplary embodiments, the first driving circuit 110 and the second driving circuit 120 are symmetrically located on two sides of the display region 101.

Figure 2:
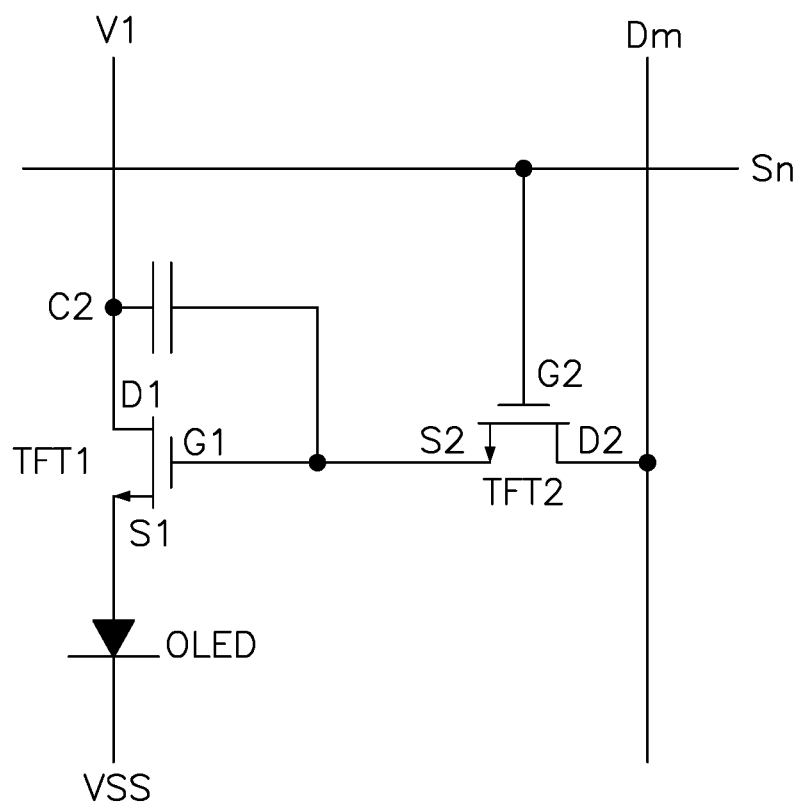
FIG. 2 is a diagram view of a pixel driving circuit of FIG. 1.

The display panel 10 further includes a plurality of scan lines $S_1$-$S_n$ located in a display region 101 and a plurality of data lines $D_1$-$D_m$ located in the display region 101. The scan lines $S_1$-$S_n$ extending along a first direction X with the data lines $D_1$-$D_m$ extending along a second direction Y perpendicular to the first direction X, in a grid formation, to define a plurality of pixel units 20. Each pixel unit 20 corresponds to a pixel driving circuit 30 (as shown in FIG. 2). The pixel driving circuit 30 is located in the display region 101, and drives the pixel unit 20 based on signals from the scan line $S_n$ and the data line $D_m$.

As shown in FIG. 2, each pixel driving circuit 30 is electrically connected to a power line V1, a data line $D_m$, a scan line $S_n$, and a reference line VTP. The pixel driving circuit 30 includes a first transistor TFT1, a second transistor TFT2, a capacitor C2, and an organic light emitting diode (OLED). A gate electrode G2 of the second transistor TFT2 is electrically connected to the scan line $S_n$, a source electrode S2 of the second transistor TFT2 is electrically connected to a gate electrode G1 of the first transistor TFT1, and a drain electrode D2 of the second transistor TFT2 is electrically connected to the data line $D_m$. A source electrode S1 of the first transistor TFT1 is electrically connected to an anode of the OLED, and a drain electrode D1 of the first transistor TFT1 is electrically connected to the power line V1. A cathode of the OLED is electrically connected to the reference line VTP. The capacitor C2 is electrically connected between the gate electrode G1 and the drain electrode D1 of the first transistor TFT1. In at least one exemplary embodiment, the first transistor TFT1 and the second transistor TFT2 are p-type thin film transistors.

The first driving circuit 110 sequentially supplies a scan signal to one of the scan lines S1-Sn for scanning the pixel units 20 during one frame time for displaying images. The second driving circuit 120 allots data signals to the data lines D1-Dm for displaying an image during one frame time. The first driving circuit 110 and the second driving circuit 120 may be connected to the bonding pads of the display panel 10 by tape-automated bonding (TAB) or chip-on-glass (COG) bonding, or may be implemented as a gate-in-panel (GIP)-type IC directly disposed on the display panel 10, or may be integrated with the display panel 10 to form a portion of the display panel 10. Alternatively, each of the gate drivers IC may be mounted on a film connected to the display panel 10 by a chip-on film (COF) method. The time controller 130 supplies various control signals to the first driving circuit 110 and the second driving circuit 120 for driving the display apparatus 100 to display images, and further supplies the data signals to the second driving circuit 120. The various control signals may includes a vertical synchronization (Vsync) signal, a horizontal synchronization (Hsync) signal, a clock (CLK) signal, and a data enable (DE) signal, but is not limited thereto.

Figure 3:
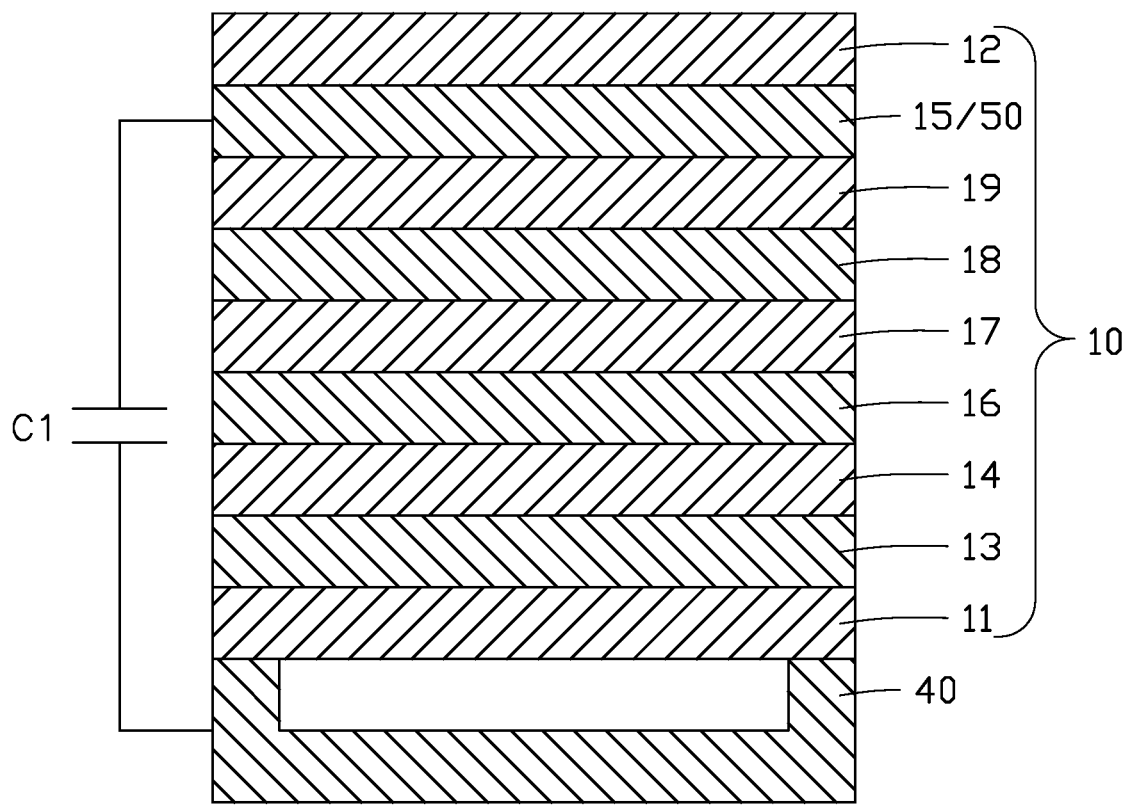
FIG. 3 is a cross-sectional view of a first exemplary embodiment of the self-luminescence display apparatus of FIG. 1.
Figure 5:
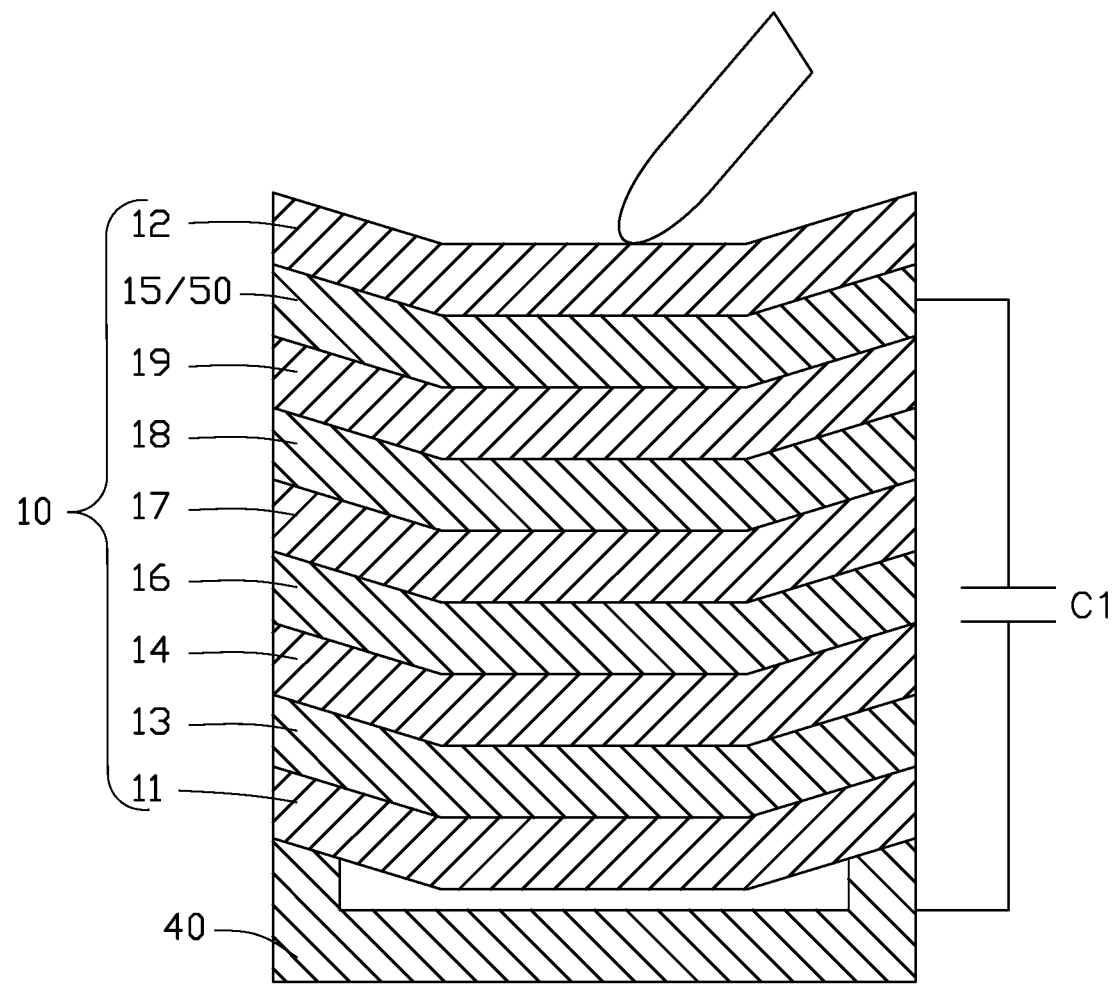
FIG. 5 is a cross-sectional view of the self-luminescence display apparatus of FIG. 3 being touched.

FIG. 3 illustrates the self-luminescence display apparatus 100. The self-luminescence display apparatus 100 further includes a supporting frame 40 for supporting the display panel 10. The display panel 10 includes multi-conductive layers. A specified layer of the multiple layers of the display panel 10 cooperates with the supporting frame 40 to sense a pressure of the touch. The specified layer is patterned to form a plurality of pressure sensing electrodes. Each pressure sensing electrode cooperates with the supporting frame 40 to form a force sensing capacitor C1. Only one force sensing capacitor C1 is shown in FIG. 3. Each force sensing capacitor C1 is capable of sensing a pressure of a touch. When there is no touch, a distance between the specified layer in the display panel 10 and the supporting frame 40 serves as a predetermined distance, and the capacitance of the force sensing capacitor C1 is in an initial capacitance. As shown in FIG. 5, when a touch occurs, the distance between the specified layer and the supporting frame 40 decreases, which causes the capacitance of the force sensing capacitor C1, which corresponds to a place where the touch action is applied, to increase. The self-luminescence display apparatus 100 calculates a difference between the initial capacitance of the force sensing capacitor C1 and the current capacitance of the force sensing capacitor C1, and processes the difference to sense the pressure of the touch action. In at least one exemplary embodiment, the supporting frame 40 is a mid frame of the self-luminescence display apparatus 100, and is made of metal, such as cooper or steel.

The display panel 10 further includes a first substrate 11, a second substrate 12, and a thin film transistor (TFT) array layer 13 disposed on a surface of the first substrate 11 facing the second substrate 12. A first electrode layer 14 is disposed on a surface of the TFT array layer 13 away from the first substrate 11, and a second electrode layer 15 is between the first electrode layer 14 and the second substrate 12. A hole injection layer 16, a hole transport layer 17, an emission layer 18, and an electric injection layer 19 are also included. The second electrode layer 15 also serves as a touch unit 50. The first electrode layer 14, the second electrode layer 15, the hole injection layer 16, the hole transport layer 17, the emission layer 18, and the electric injection layer 19 cooperate with each to form a plurality of OLEDs.

The first substrate 11 and the second substrate 12 are made of, for example, transparent glass, quartz, or plastic. Further, in other exemplary embodiment, the first substrate 11 and the second substrate 12 may be, for example, a flexible substrate. Suitable materials for the flexible substrate comprise, for example, polyethersulfone (PES), polyethylenenaphthalate (PEN), polyethylene (PE), polyimide (PI), polyvinyl chloride (PVC), polyethylene terephthalate (PET), or combinations thereof.

The TFT array layer 13 includes a TFT array (not shown) formed on a surface of the first substrate 11.

The first electrode layer 14 serves as an anode electrode of the OLED in the pixel unit 20.

The second electrode layer 15 can be patterned to form a plurality of first electrodes 151 as shown in FIG. 4. The first electrode 151 serves as a cathode electrode of the OLED in the pixel unit 20 during a display period, serves as a position sensing electrode during a touch period, and serves as a force sensing electrode during a force sensing period. The first electrodes 151 are parallel with each other. The first electrodes 151 can be driven to sense a position of the touch action applied on the self-luminescence display apparatus 100. Each first electrode 151 is electrically connected to a touch circuit 160 (as shown in FIG. 4) through at least one connecting line 141. The connecting lines 141 are located at a layer, which is different from the second conductive layer 15, and each connecting lines 141 is connected to the corresponding first electrode 151 through at least one hole 153. In at least one exemplary embodiment, each first electrode 151 is electrically connected to the corresponding connecting line 141 through three holes 153. The first electrode 151 can be a self-capacitor for sensing a position of the touch action applied on the self-luminescence display apparatus 100. The touch circuit 160 generates touch sensing signals to the first electrodes 151 through the connecting line 141.

The hole injection layer 16, the hole transport layer 17, the emission layer 18, and the electric injection layer 19 are sequentially arranged between the first electrode layer 14 and the second electrode layer 15. The hole injection layer 16 is adjacent to the first electrode layer 14. The electric injection layer 19 is adjacent to the second electrode layer 15. The OLEDs radiate light due to an excitation state when the hole and the electron are recombined at the emission layer 18.

Figure 6:
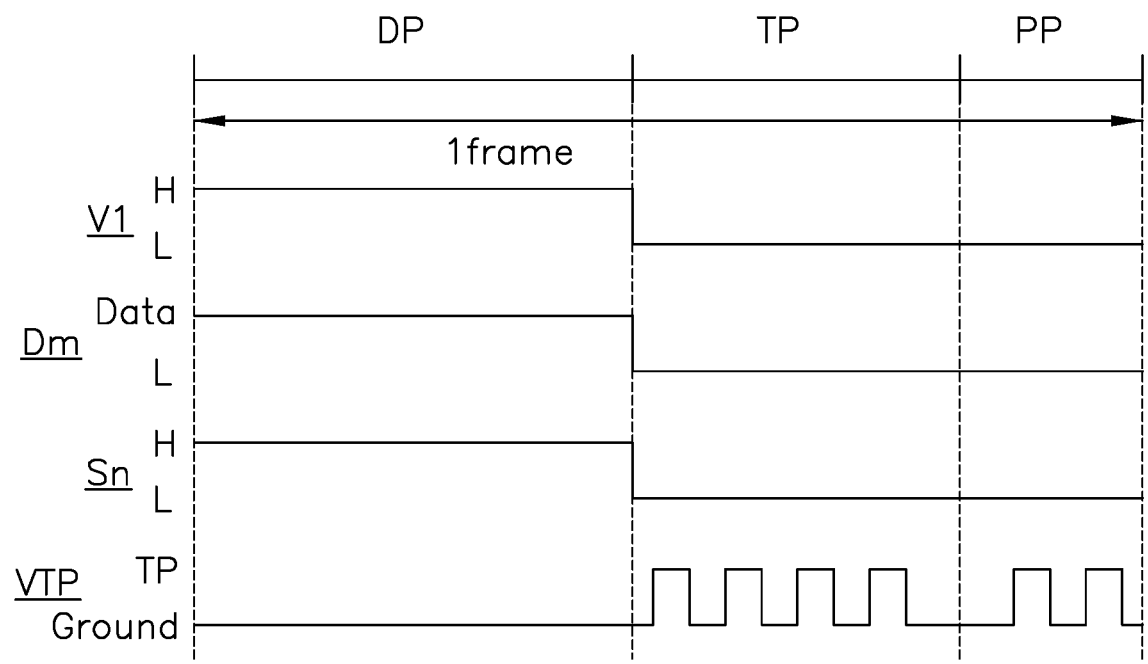
FIG. 6 is a diagram of an exemplary embodiment of a driving time sequence of the self-luminescence display apparatus of FIG. 1.

FIG. 6 is a driving time sequence of one pixel unit 20 of the self-luminescence display apparatus 100 in one frame time. In one frame time, the self-luminescence display apparatus 100 sequentially operates under a display period DP, a touch period TP, and a force sensing period PP. During the display period DP, the first transistor TFT1 and the second transistor TFT2 firstly turn on for allotting data signal on the data line $D_m$ to the second transistor TFT2, and then the second transistor TFT2 turns off, a current from the first transistor TFT1 is applied on an anode electrode of the OLED, thus the OLED emits light. The touch circuit 160 controls the first electrodes 151 to be grounded, thus the first electrodes 151 disables sensing the position and the pressure of the touch action applied on the self-luminescence display apparatus 100. During the touch period TP and the force sensing period PP, the first transistor TFT1 and the second transistor TFT2 turn off, thus the OLED stops emitting light, and the touch circuit 160 provides a touch signal to the reference line VTP, the touch electrodes 151 receives the touch signal. During the touch period TP, the touch circuit 160 senses a position of the touch action applied on the self-luminescence display apparatus 100 based on the first electrode 151. During the force sensing period PP, the touch circuit 160 senses the pressure of the touch action applied on the self-luminescence display apparatus 100, based on a capacitance difference of the force sensing capacitor C1, which corresponds to a place where the touch action is applied. In at least one exemplary embodiment, the touch signal is a square wave.

Figure 7:
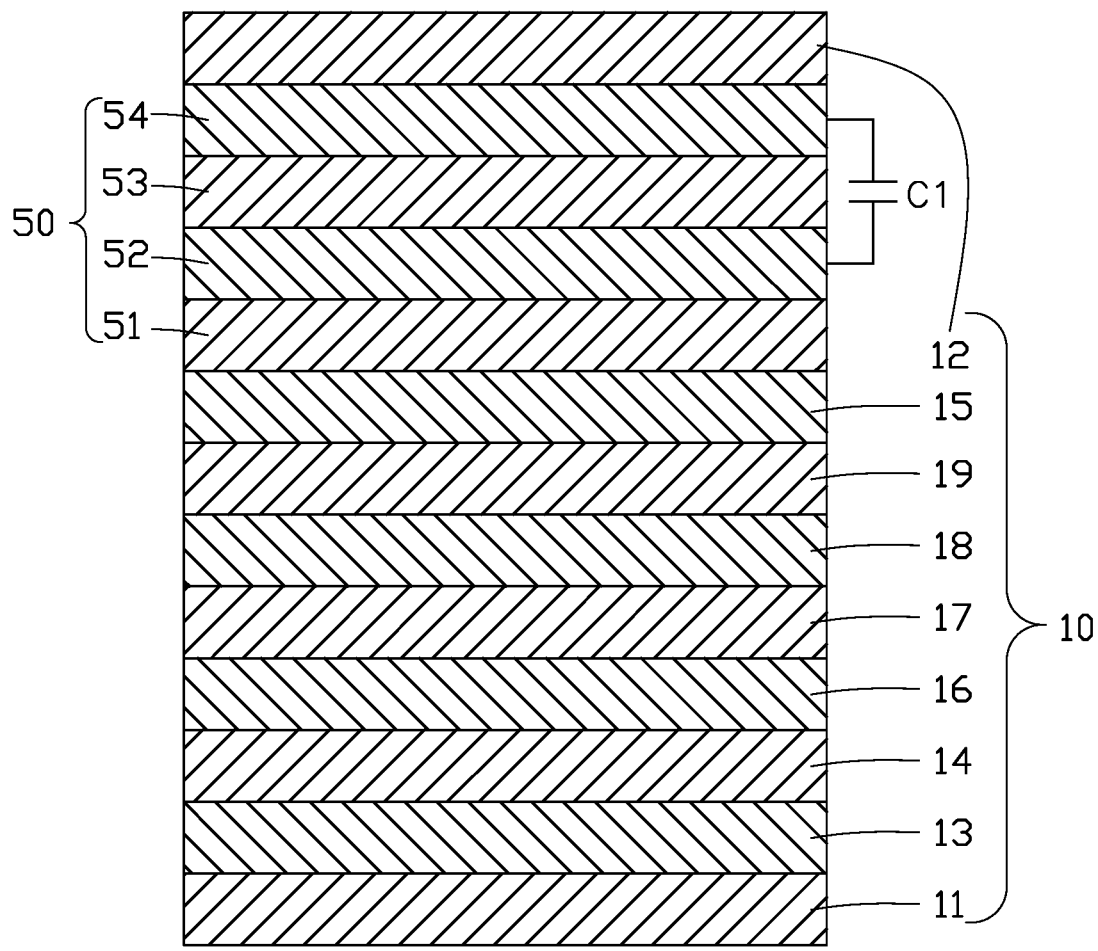
FIG. 7 is a cross-sectional view of a second exemplary embodiment of the self-luminescence display apparatus.

FIG. 7 illustrates a second exemplary embodiment of the self-luminescence display apparatus 200. The self-luminescence display apparatus 200 is similar to the self-luminescence display apparatus 100. Elements in FIG. 7 with the same labels are the same as the elements in FIG. 1. The difference between the self-luminescence display apparatus 200 and the self-luminescence display apparatus 100 is that the self-luminescence display apparatus 200 includes an independent touch unit 50. The touch unit 50 is disposed between the second substrate 12 and the second electrode layer 15.

The touch unit 50 includes a passivation layer 51 disposed on a surface of the second electrode layer 15 facing the second substrate 12, a first conductive layer 52, a compressible layer 53, and a second conductive layer 54. The first conductive layer 52, the compressible layer 53, and the second conductive layer 54 are stacked between the second electrode layer 15 and the second substrate 12.

The passivation layer 51 is directly located on the second conductive layer 15, and insulates the first conductive layer 52 from the second electrode layer 15.

The first conductive layer 52 is located on the passivation layer 51, and is in proximity of the compressible layer 53. The first conductive layer 52 cooperates with the second conductive layer 54 to sense a position of the touch. The first conductive layer 52 is supplied with a specified voltage during a touch period in one frame time. The first conductive layer 52 can be patterned to form a plurality of electrodes for sensing the position of the touch action applied on the self-luminescence display apparatus 200. In at least one exemplary embodiment, the specified voltage is 0V, or a low level voltage.

The compressible layer 53 is located on a surface of the first conductive layer 52, and is capable of being deformed. The compressible layer 53 is made of a transparent material, such as polyethersulfone (PES), polyethylene naphthalate (PEN), polyethylene (PE), polyimide (PI), polyvinyl chloride (PVC), polyethylene terephthalate (PET), or combinations thereof.

The second conductive layer 54 is located on a surface of the compressible layer 53 adjacent to the second substrate 12. The second conductive layer 54 also can be patterned to form a plurality of first electrodes 151. The first electrodes 151 and the electrodes of the first conductive layer 52 cooperate with each other to form a plurality of force sensing capacitors C1 for sensing the pressure of the touch. The first electrodes 151 also can serves as position sensing electrodes in the touch sensing period TP, which are cooperated with the electrodes of the first conductive layer 52, for sensing a position of the touch action applied on the self-luminescence display apparatus 200.

When there is no touch, a distance between the first conductive layer 52 and the second conductive layer 54 serves as a predetermined distance, and the capacitance of the force sensing capacitor C1 is in an initial capacitance. When the self-luminescence display apparatus 200 is touched, the distance between the first conductive layer 52 and the second conductive layer 54 decreases, which causes the capacitance of the force sensing capacitor C1, which corresponds to a place where the touch action is applied, to increase. The self-luminescence display apparatus 200 calculates a difference between the initial capacitance of the force sensing capacitor C1 and the current capacitance of the force sensing capacitor C1, and processes the difference to sense the pressure of the touch action.

Figure 8:
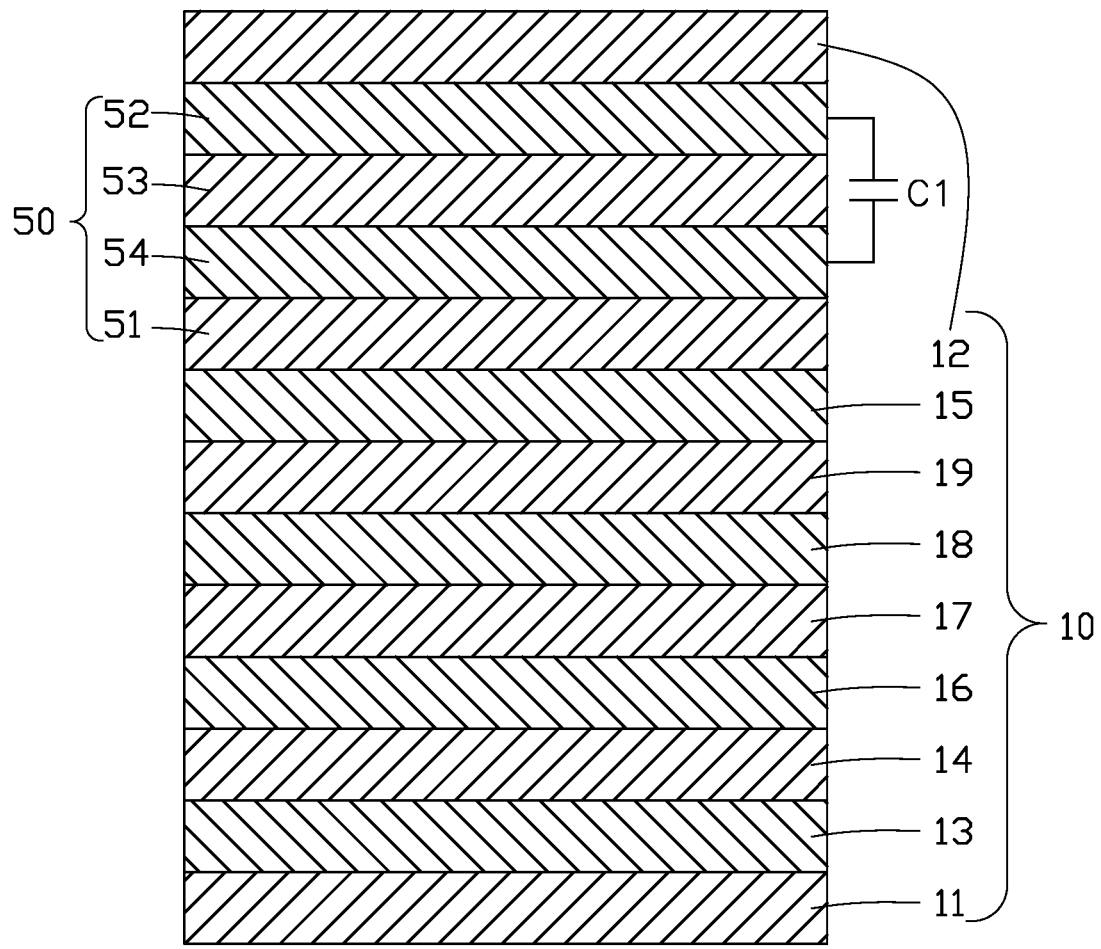
FIG. 8 is a cross-sectional view of a third exemplary embodiment of the self-luminescence display apparatus.

FIG. 8 illustrates a third exemplary embodiment of the self-luminescence display apparatus 300. The self-luminescence display apparatus 300 is similar to the self-luminescence display apparatus 200. The elements in FIG. 8 with the same labels are the same as the elements in FIG. 1. The difference between the self-luminescence display apparatus 300 and the self-luminescence display apparatus 200 is in the respective positions of the first conductive layer 52 and the second conductive layer 54. The second conductive layer 54 is located on a surface the passivation layer 51 away from the second conductive layer 15, and the first conductive layer 52 is located on a surface of the compressible layer 53 adjacent to the second substrate 12. In other words, the position of the first conductive layer 52 and the second conductive layer 55 are exchanged with respect to the self-luminescence display apparatus 200.

Figure 9:
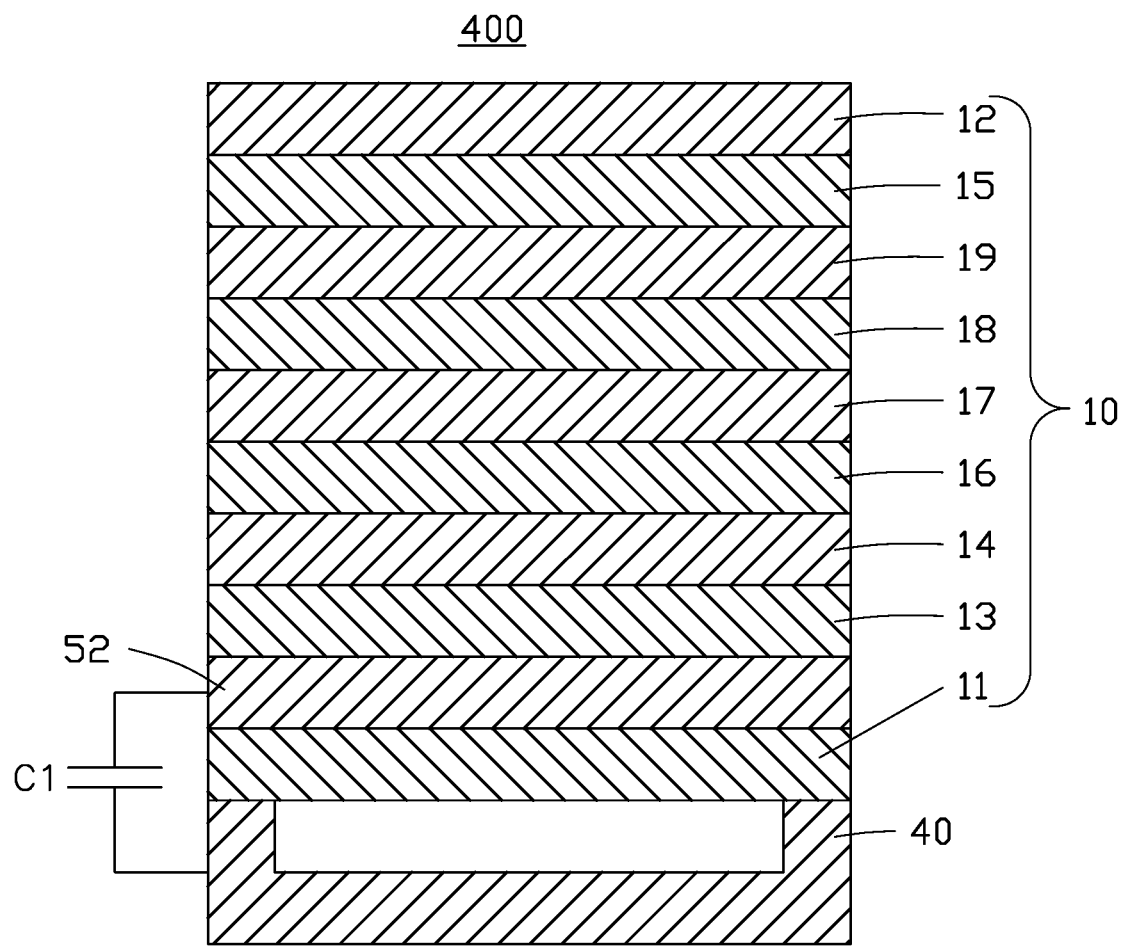
FIG. 9 is a cross-sectional view of a fourth exemplary embodiment of the self-luminescence display apparatus.

FIG. 9 illustrates a fourth exemplary embodiment of the self-luminescence display apparatus 400. The self-luminescence display apparatus 400 is similar to the self-luminescence display apparatus 100. The elements in FIG. 9 with the same labels are the same as the elements in FIG. 1. The self-luminescence display apparatus 400 further includes a first conductive layer 52 as the touch unit 50. The first conductive layer 52 is located between the first substrate 11 and the 13. The first conductive layer 52 and the supporting frame 40 cooperated with each other to form a plurality of force sensing capacitors for sensing a pressure of the touch action applied on the self-luminescence display apparatus 400. The first conductive layer 52 also can be patterned to form a plurality of first electrodes 151 for sensing a position of the touch action that is applied on the self-luminescence display apparatus 400.

Figure 10:
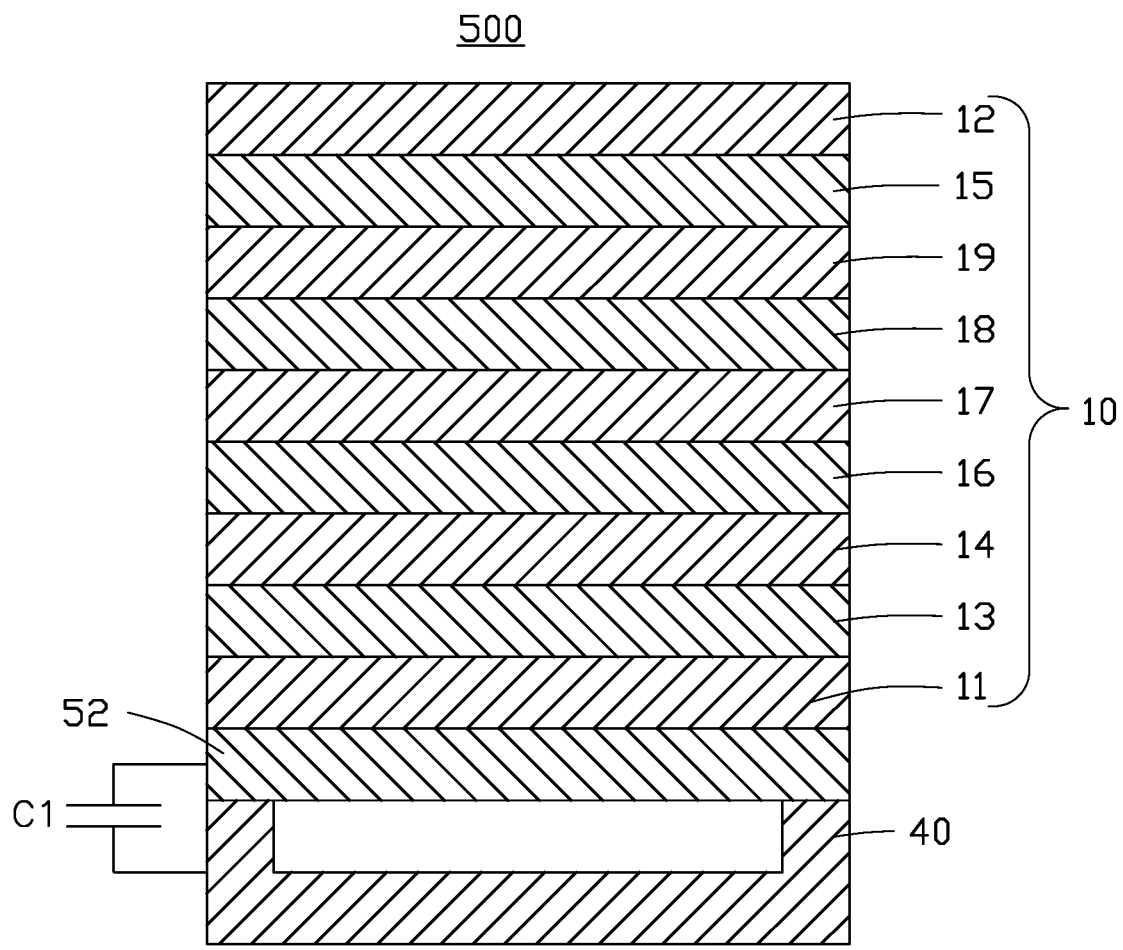
FIG. 10 is a cross-sectional view of a fifth exemplary embodiment of the self-luminescence display apparatus.

FIG. 10 illustrates a fifth exemplary embodiment of the self-luminescence display apparatus 500. The self-luminescence display apparatus 500 is similar to the self-luminescence display apparatus 400. The elements in FIG. 10 with the same labels are the same as the elements in FIG. 9. The difference between the self-luminescence display apparatus 500 and the self-luminescence display apparatus 400 is in the respective first conductive layer 52 as the touch unit 50. The first conductive layer 52 is located between the first substrate 11 and the supporting frame 40.

Figure 11:
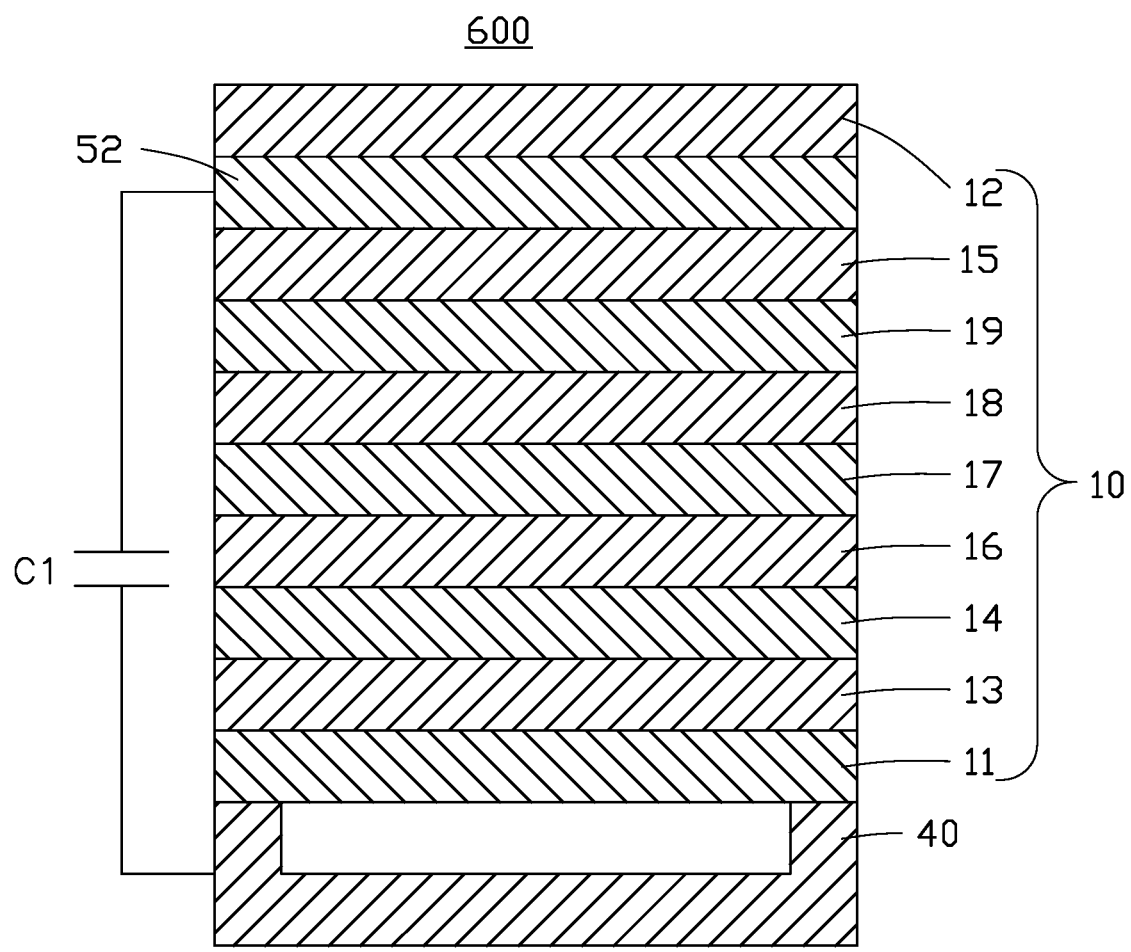
FIG. 11 is a cross-sectional view of a sixth exemplary embodiment of the self-luminescence display apparatus.

FIG. 11 illustrates a sixth exemplary embodiment of the self-luminescence display apparatus 600. The self-luminescence display apparatus 600 is similar to the self-luminescence display apparatus 400. The elements in FIG. 11 with the same labels are the same as the elements in FIG. 9. The difference between the self-luminescence display apparatus 600 and the self-luminescence display apparatus 100 is in the respective first conductive layer 52 being the touch unit 50. The first conductive layer 52 is located between the second substrate 12 and the second conductive layer 15.

The structure of the self-luminescence display apparatus renders it capable of sensing the pressure and the position of the touch action. Therefore, a touch function of the self-luminescence display apparatus is improved.

While various exemplary and preferred exemplary embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A self-luminescence display apparatus comprising:
    an organic light emitting diode (OLED) display panel having a plurality of conductive layers, the conductive layers comprising:
        a first substrate;
        a second substrate opposite to the first substrate;
        a thin film transistor (TFT) array layer located on the first substrate;
        a first electrode layer located on the first substrate; and
        a second electrode layer located on the first electrode layer;
    a touch unit located between the second electrode layer and the second substrate;
    wherein the touch unit forms a plurality of force sensing capacitors; when a touch action is applied on the self-luminescence display apparatus, the touch unit deforms, thereby causing capacitances of the force sensing capacitors to be altered, and sensing a force applied on the self-luminescence display apparatus based on capacitance differences of the plurality of force sensing capacitors, which correspond to a place where the touch action is applied;
    wherein in one frame time, the self-luminescence display apparatus sequentially operates in a display period, a touch period, and a force sensing period; the touch unit comprises a first conductive layer with a plurality of electrodes, a second conductive layer, and a compressible layer between the first conductive layer and the second conductive layer; the second conductive layer comprises a plurality of first electrodes; the electrodes of the first conductive layer served as self-capacitance electrodes sense a position of the touch action during the touch period; each electrode of the first conductive layer cooperates with one of the first electrodes of the second conductive layer to form one of the plurality of force sensing capacitors during the force sensing period, and the plurality of the force sensing capacitors sense the force of the touch action during the force sensing period.

2. The self-luminescence display apparatus of claim 1, wherein the touch unit further comprises a passivation layer disposed on a surface of second electrode layer facing the second substrate; the passivation layer insulates the first conductive layer from the second electrode layer; the compressible layer is capable of deforming based on the force applied on the self-luminescence display apparatus.

3. The self-luminescence display apparatus of claim 2, wherein the first conductive layer is located on the passivation layer, and is in proximity to the compressible layer; the second conductive layer is located on a surface of the compressible layer away from the passivation layer.

4. The self-luminescence display apparatus of claim 2, wherein the first conductive layer is located on a surface of the compressible layer away from the passivation layer; the second conductive layer is located on the passivation layer, and is in proximity to the compressible layer.

\* \* \* \* \*